United States Patent
Safai

(10) Patent No.: US 9,386,694 B1
(45) Date of Patent: Jul. 5, 2016

(54) SUPER LIGHT WEIGHT ELECTRONIC CIRCUIT AND LOW POWER DISTRIBUTION IN AIRCRAFT SYSTEMS

(71) Applicant: The Boeing Company, Chicago, IL (US)

(72) Inventor: Morteza Safai, Newcastle, WA (US)

(73) Assignee: The Boeing Company, Chicago, IL (US)

( * ) Notice: Subject to any disclaimer, the term of this patent is extended or adjusted under 35 U.S.C. 154(b) by 77 days.

(21) Appl. No.: 14/570,827

(22) Filed: Dec. 15, 2014

(51) Int. Cl.
*H05K 1/02* (2006.01)
*H05K 3/20* (2006.01)
*F21K 99/00* (2016.01)

(52) U.S. Cl.
CPC ............... *H05K 1/0296* (2013.01); *F21K 9/90* (2013.01); *H05K 3/20* (2013.01); *B64D 2221/00* (2013.01); *H05K 2201/10106* (2013.01)

(58) Field of Classification Search
CPC .. B64D 2221/00; B64D 47/02; H05K 1/0296; H05K 3/20; H05K 2201/10106; F21K 9/90; F21V 19/001; F21V 19/003
See application file for complete search history.

(56) References Cited

U.S. PATENT DOCUMENTS

| | | | |
|---|---|---|---|
| 7,897,876 B2 | 3/2011 | Tsotsis et al. | |
| 8,163,205 B2 | 4/2012 | Zhou et al. | |
| 8,263,843 B2 * | 9/2012 | Kim | B82Y 10/00 252/503 |
| 8,450,202 B1 | 5/2013 | Humfeld | |
| 8,813,352 B2 | 8/2014 | Huang et al. | |
| 8,866,384 B2 | 10/2014 | Wang et al. | |
| 8,871,545 B2 | 10/2014 | Lee et al. | |
| 9,066,426 B2 * | 6/2015 | Zhou | H05K 1/0296 |
| 9,234,633 B2 * | 1/2016 | Lo | H01L 25/0753 |
| 2011/0108978 A1 | 5/2011 | Kim et al. | |
| 2012/0324703 A1 | 12/2012 | Kim et al. | |
| 2014/0027161 A1 * | 1/2014 | Lee | H05K 1/09 174/257 |
| 2015/0060782 A1 * | 3/2015 | Li | H01L 27/3244 257/40 |

* cited by examiner

*Primary Examiner* — Bao Q Truong
(74) *Attorney, Agent, or Firm* — John S. Economou

(57) ABSTRACT

A method and system for applying conductive traces to a structure to complete an electrical circuit. One or more graphene traces is formed on a substrate. The substrate is applied to the structure such that one or more first portions of the electrical circuit are electrically connected to respective one or more second portions of the electrical circuit by respective ones of the one or more graphene traces. The substrate may be removed from the structure such that the graphene traces remain on the structure. The structure is preferably a fuselage of an aircraft and is formed from a composite material. The substrate may be applied to the structure is prior to curing of the composite material and/or prior to a complete formation of the fuselage, such that, after the fuselage is completely formed, the one or more graphene traces become embedded within the composite material forming the fuselage.

19 Claims, 2 Drawing Sheets

SUPER LIGHT WEIGHT ELECTRONIC CIRCUIT AND LOW POWER DISTRIBUTION IN AIRCRAFT SYSTEMS

FIELD

This disclosure relates generally to electrical conductors, and more specifically, to highly conductive electrical circuits that are reduced in weight as compared to copper and aluminum wire conductor implementations that are equivalent in conductivity.

BACKGROUND

It is a continuing goal to reduce the cost and weight of aircraft, spacecraft, and many other devices that include one or more electrical functions. Aircraft, for example, typically include thousands of feet of copper or aluminum wire embedded in an insulator. This wire requires a great deal of time for both manufacturing and installation, and contributes a great deal to the weight of the aircraft. Added weight results in a corresponding increase in fuel consumption and/or a decrease in payload capacity.

In most existing applications, electrical power, current, and electrical signals are typically conducted through wires or cables using copper or aluminum as the conductive medium. In these applications, the amount of power, current, and signal strength are inherently limited by the electrical resistivity of the conducting materials, such as copper and aluminum, used to implement the electrical path. In addition, since copper and aluminum conductors include a resistance, current flowing through such conductors causes the wire to generate heat. A conductor with a lower resistance per unit area will tend to reduce the amount of heat generated (and electrical energy lost due to such generated heat) within a system.

Accordingly, there is a need for an electrical conductor for use in aircraft which overcomes the drawbacks of conventional copper and aluminum conductors.

SUMMARY

In one aspect, a method for applying conductive traces to a structure to complete an electrical circuit. One or more graphene traces are formed on a substrate. Then the substrate is applied to the structure such that one or more first portions of the electrical circuit are electrically connected to respective one or more second portions of the electrical circuit by respective ones of the one or more graphene traces.

In a further embodiment, the substrate may be removed from the structure such that the graphene traces remain on the structure. In addition, the structure may comprise a fuselage of an aircraft. Further, the fuselage of the aircraft may be formed from a composite material, and the substrate may be applied to the structure prior to curing of the composite material. Alternatively, when the fuselage of the aircraft is formed from a composite material, the substrate may be applied to the structure prior to a complete formation of the fuselage, such that, after the fuselage is completely formed, the one or more graphene traces become embedded within the composite material forming the fuselage. The at least one of the one or more graphene traces may be used to conduct electrical signals and/or electrical power. The substrate may be bonded to the structure when applied so that the substrate acts as an insulator for the one or more graphene traces. Still further, the substrate may include additional electrical circuitry. The additional electrical circuitry may be one or more organic light emitting diodes.

In another aspect, a method for applying conductive traces to a structure to complete an electrical circuit. One or more graphene traces is formed on a substrate. The substrate is applied to the structure such that one or more first portions of the electrical circuit are electrically connected to respective one or more second portions of the electrical circuit by respective ones of the one or more graphene traces. Finally, the substrate is removed from the structure such that the graphene traces remain on the structure.

In a still further aspect, a system for electrically coupling two portions of one or more electrical circuits. The system includes a substrate and one or more graphene traces formed on the substrate. Each of the one or more graphene traces is adapted to electrically couple a first portion of a respective one of the one or more electrical circuits to a second portion of the respective one of the one or more electrical circuits. The system may further include additional electrical circuitry formed on the substrate. The additional electrical circuitry may be one or more organic light emitting diodes. Finally, at least one portion of the one or more electrical circuits may be mounted on an interior surface of an aircraft fuselage.

The features, functions, and advantages that have been discussed can be achieved independently in various embodiments or may be combined in yet other embodiments, further details of which can be seen with reference to the following description and drawings.

BRIEF DESCRIPTION OF THE DRAWINGS

The following detailed description, given by way of example and not intended to limit the present disclosure solely thereto, will best be understood in conjunction with the accompanying drawings in which.

DETAILED DESCRIPTION

In the present disclosure, like reference numbers refer to like elements throughout the drawings, which illustrate various exemplary embodiments of the present disclosure.

Graphene is a one-atom-thick planar sheet of $sp^2$-bonded carbon atoms that are densely packed in a honeycomb (hexagonal) crystal lattice. Graphene has a density of approximately 1.7 $g/cm^3$. Graphene is strong, light, nearly transparent and an excellent conductor of heat and electricity. The carbon/carbon bond length in graphene can be as thick as 0.142 nanometers. Graphene nanosheets are formed from layers of graphene. Graphene has a high carrier mobility and low noise susceptibility and thus is quite useful in electronic circuits.

Figure 1:
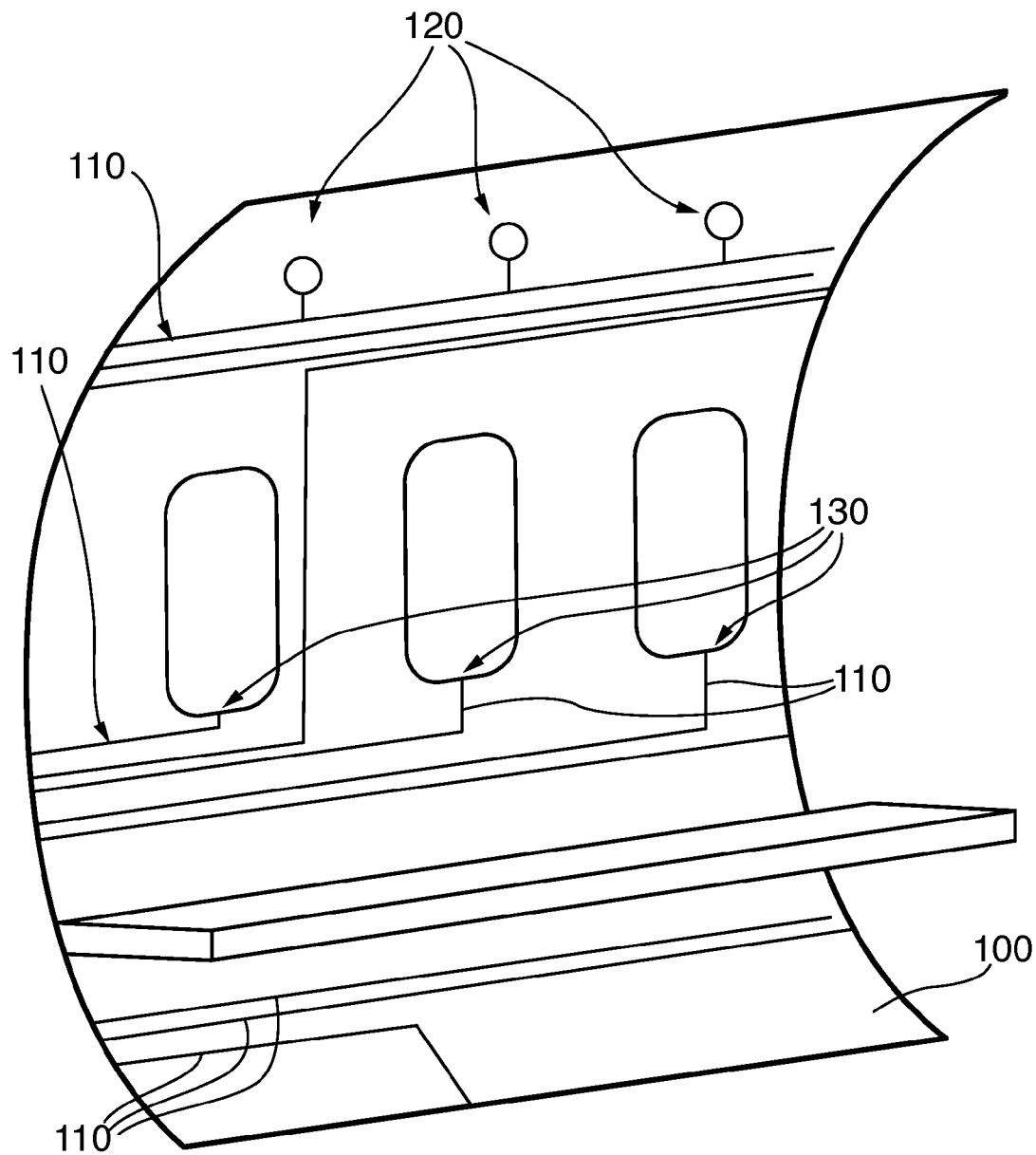
FIG. 1 is a diagram showing graphene traces on an interior surface of an aircraft fuselage according to an embodiment of the present disclosure.

Referring now to FIG. 1, according to the present disclosure, conductive traces 110 formed from graphene nanosheets are bonded to the inner surface of a fuselage 100 of an aircraft to complete a number of electrical circuits. Such conductive traces 110 may provide low-voltage power to interior cabin lighting 120 and to window heaters 130 from a power source. In addition, the conductive traces 110 may also pass electrical signals to other electrical equipment within the aircraft, for example, digital audio and/or video signals for entertainment systems, electrical power for emergency lighting systems, etc. from a main distribution point. As one of ordinary skill in the art will readily recognize, the conductive traces 110 formed from graphene nanosheets may replace any of the conventional wiring in an aircraft used for such purposes.

Figure 2:
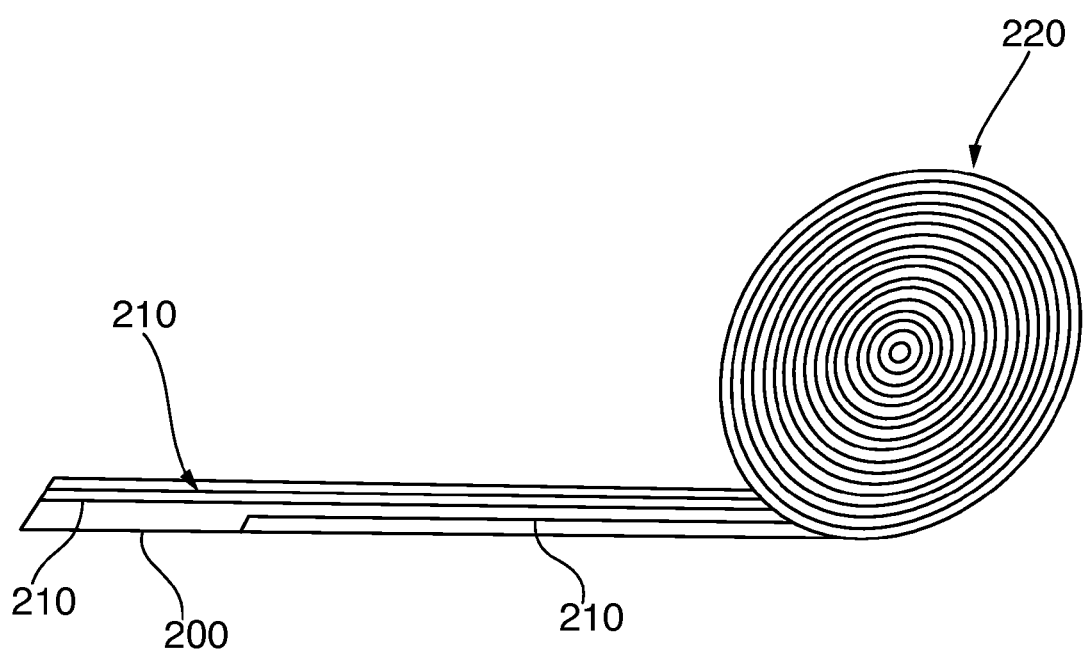
FIG. 2 is a diagram showing graphene traces pre-printed on a substrate roll according to an aspect of the present disclosure.

Referring now to FIG. 2, the graphene traces 210 may be formed on an appropriate substrate 200 as a single roll 220 of graphene decals, with all circuit traces pre-printed on the substrate 200 of such rolls. Substrate 200 may be formed from, for example, carbon fiber tape, fiberglass tape or Kevlar tape. These rolls 220 can bonded to structures (such as the fuselage 100 in FIG. 1). In one embodiment, the substrate 200 may be removed, leaving the graphene traces 210 behind on the surface of such structure. Notably, because graphene can stand high temperature, the graphene traces 210 can withstand high temperature curing of a composite in an auto clave, making this circuitry desirable for use with fuselages formed from composite materials. In another embodiment, the original substrate 200 can also be bonded to the structure and serve as a protective layer for the graphene traces 210 (e.g., for insulation purposes). In a still further embodiment, the rolls 220 may be bonded to a fuselage formed from a composite during manufacturing of such fuselage such that, after substrate 200 is removed, formation of the fuselage continues and the graphene traces 210 become embedded within the composite material.

In FIG. 2, the graphene traces 210 are pre-printed on a bare substrate 200 that is formed into a roll 220. In the alternative, the graphene traces 210 may be preprinted on substrates which also include other types of circuits, e.g., OLEDs (organic light emitting diodes), P-OLEDs (polymer organic light emitting diodes), etc., such that the substrate, when mounted on the inner surface of the fuselage, can provide additional functionality, e.g., interior lighting, based on the included additional circuits.

The use of graphene traces, as opposed to conventional copper or aluminum wiring, can provide significant savings in both weight and manufacturing costs. These circuits based on graphene traces can be embedded in an aircraft fuselage formed from either a composite material or a metal material, and in other structures formed from composites and/or metal. The elimination of conventional copper or aluminum wiring provides a significant weight savings and a significant reduction in the manufacturing and assembly process of the aircraft. This results in both a significant reduction in cost of each aircraft and an improved per mile revenue for each aircraft because of fuel savings achieved by the lighter aircraft.

Although the present disclosure has been particularly shown and described with reference to the disclosed embodiments and various aspects thereof, it will be appreciated by those of ordinary skill in the art that various changes and modifications may be made without departing from the spirit and scope of the disclosure. It is intended that the appended claims be interpreted as including the embodiments described herein, the alternatives mentioned above, and all equivalents thereto.

What is claimed is:

1. A method for applying conductive traces to a structure to complete an electrical circuit, comprising the steps of:
   forming one or more graphene traces on a substrate; and
   applying the substrate to the structure such that one or more first portions of the electrical circuit are electrically connected to respective one or more second portions of the electrical circuit by respective ones of the one or more graphene traces.

2. The method of claim 1, further comprising the step of removing the substrate from the structure such that the graphene traces remain on the structure.

3. The method of claim 1, wherein the structure comprises a fuselage of an aircraft.

4. The method of claim 3, wherein the fuselage of the aircraft is formed from a composite material, and the step of applying the substrate to the structure is performed prior to curing of the composite material.

5. The method of claim 3, wherein the fuselage of the aircraft is formed from a composite material, and wherein the step of applying the substrate to the structure is performed prior to a complete formation of the fuselage, such that, after the fuselage is completely formed, the one or more graphene traces become embedded within the composite material forming the fuselage.

6. The method of claim 1, further comprising the step of using at least one of the one or more graphene traces to conduct electrical signals.

7. The method of claim 1, further comprising the step of using at least one of the one or more graphene traces to conduct electrical power.

8. The method of claim 1, wherein the applying substrate to the structure bonds the substrate to the structure so that the substrate acts as an insulator for the one or more graphene traces.

9. The method of claim 1, wherein the substrate includes additional electrical circuitry.

10. The method of claim 9, wherein the additional electrical circuitry comprises one or more organic light emitting diodes.

11. A method for applying conductive traces to a structure to complete an electrical circuit, comprising the steps of:
    forming one or more graphene traces on a substrate;
    applying the substrate to the structure such that one or more first portions of the electrical circuit are electrically connected to respective one or more second portions of the electrical circuit by respective ones of the one or more graphene traces; and
    removing the substrate from the structure such that the graphene traces remain on the structure.

12. The method of claim 11, wherein the structure comprises a fuselage of an aircraft.

13. The method of claim 12, wherein the fuselage of the aircraft is formed from a composite material, and the step of applying the substrate to the structure is performed prior to curing of the composite material.

14. The method of claim 12, wherein the fuselage of the aircraft is formed from a composite material, and wherein the step of applying the substrate to the structure is performed prior to a complete formation of the fuselage, such that, after the fuselage is completely formed, the one or more graphene traces become embedded within the composite material forming the fuselage.

15. The method of claim 11, further comprising the step of using at least one of the one or more graphene traces to conduct electrical signals.

16. The method of claim 11, further comprising the step of using at least one of the one or more graphene traces to conduct electrical power.

17. A system for electrically coupling two portions of one or more electrical circuits, comprising:
    a substrate;
    one or more graphene traces formed on the substrate, each of the one or more graphene traces adapted to electrically couple a first portion of a respective one of the one or more electrical circuits to a second portion of the respective one of the one or more electrical circuits; and wherein at least one portion of the one or more electrical circuits is mounted on an interior surface of an aircraft fuselage.

18. The system of claim 17, further comprising additional electrical circuitry formed on the substrate.

19. The system of claim 17, wherein the additional electrical circuitry comprises one or more organic light emitting diodes.

* * * * *